United States Patent [19]
Ohta et al.

[11] Patent Number: 5,153,753
[45] Date of Patent: Oct. 6, 1992

[54] ACTIVE MATRIX-TYPE LIQUID CRYSTAL DISPLAY CONTAINING A HORIZONTAL MIM DEVICE WITH INTER-DIGITAL CONDUCTORS

[75] Inventors: Eiichi Ohta; Yuji Kimura, both of Yokohama; Hitoshi Kondo, Machida, all of Japan

[73] Assignee: Ricoh Company, Ltd., Tokyo, Japan

[21] Appl. No.: 507,038

[22] Filed: Apr. 10, 1990

[30] Foreign Application Priority Data

Apr. 12, 1989 [JP] Japan .................... 1-92108

[51] Int. Cl.$^5$ ............... G02F 1/1343; B32B 9/00; B01J 3/06
[52] U.S. Cl. ........................ 359/58; 359/87; 428/408; 156/DIG. 68; 423/446
[58] Field of Search .......... 340/784; 428/408; 156/DIG. 68; 423/446; 350/333, 332 R, 331 R, 335 US, 336 US, 334; 357/58; 359/54, 58, 62, 74, 79, 87

[56] References Cited

U.S. PATENT DOCUMENTS

| | | | |
|---|---|---|---|
| 4,534,623 | 8/1985 | Araki | 350/339 R |
| 4,775,549 | 10/1988 | Ota et al. | 427/38 |
| 4,932,331 | 6/1990 | Kurihara et al. | 423/446 X |

FOREIGN PATENT DOCUMENTS 62-291081 12/1987 Japan .
1-040929  2/1989 Japan .
0155540   3/1989 Japan .

OTHER PUBLICATIONS

Progress in Crystal Growth and Characterization, vol. 17, No. 2, Spitsyn et al., Dec. 1988, pp. 154–156.

Primary Examiner—Stanley D. Miller
Assistant Examiner—Ron Trice
Attorney, Agent, or Firm—Oblon, Spivak, McClelland, Maier & Neustadt

[57] ABSTRACT

The invention is directed to an active matrix-type liquid crystal display using a horizontal MIM device as a nonlinear resistance device. The layers of the metal-insulator-metal elements are formed in a horizontal direction and use a hard carbon film as the insulator layer of the horizontal MIM device. The hard carbon film comprises carbon and hydrogen and a constituent element such as a group III element, group IV element, group V element, alkali metal element, alkaline earth metal element, nitrogen atoms, oxygen atoms, chalcogen atoms or halogen atoms, and has typical specific resistivities of from $10^4$ to $10^{13}$ ohm.cm. The claimed devices are economical to produce and substantially free from short circuits caused by pinholes or voids in the insulator layer. In a preferred embodiment, the electrodes of the MIM device are inter-digital in shape.

1 Claim, 4 Drawing Sheets

ACTIVE MATRIX-TYPE LIQUID CRYSTAL DISPLAY CONTAINING A HORIZONTAL MIM DEVICE WITH INTER-DIGITAL CONDUCTORS

BACKGROUND OF THE INVENTION

The present invention relates to an active matrix-type liquid crystal display using an MIM (metal-insulator-metal) device as a non-linear resistance device, and applicable to a high capacitance flat-panel display such as for use in office automation equipment and television sets.

An active matrix-type liquid crystal display generally comprises a liquid crystal layer sandwiched between two insulation substrates, in which a non-linear resistance device is connected in series with an electrode for each of the picture elements disposed on at least one of the substrates. As the non-linear resistance device, an MIM device is often used.

The MIM device known comprises an insulation substrate such as a glass plate; a metal electrode as a lower electrode of Ta, Al, Ti, etc.; an insulator layer of an oxide of the metal described above, SiOx, SiNx, etc. and, further, a metal electrode as an upper electrode of Al or Cr, which are disposed on the insulation substrate in this order.

However, an MIM device using a metal oxide for the insulator layer (refer to Japanese Patent Application Laid-Open (KOKAI) Nos. 57-196589, No. 61-232689, No. 62-62333, etc.) has drawbacks as described below. Since the insulator layer is formed by anodic oxidation or thermal oxidation of the lower metal electrode, production steps are complicated and require high temperature heat-treatment (high temperature heat-treatment is also necessary in anodic oxidation for completely removing impurity, etc.). The film controllability (homogeneity and reproducibility for the film quality, and the film thickness) is also poor. In addition, the materials and characteristics of the device can not freely be changed since the material for the substrate is limited to heat-resistant material and the insulator layer is made of a metal oxide of a certain physical property, to make the degree of design freedom narrow. This means that it is impossible to design and manufacture such a device as capable of satisfying specifications demanded for a device incorporated with MIM devices, for example, a liquid crystal display.

Further, poor film controllability results in the problem that the current to voltage (I-V) characteristic is subject to wide variation. In particular, the symmetry of the current to voltage characteristic (the current ratio $I_-/I_+$ between a positive bias and negative bias) varies greatly. Moreover, it is desirable that the capacitance of an MIM device is lower in a case of using the MIM device for a liquid crystal display (LCD) since it is necessary that the ratio of liquid crystal capacitance/MIM capacitance is not less than 10. However, since a metal oxide film has a great dielectric constant, the capacitance of the device is also increased, so that precision fabrication is necessary for reducing the capacitance of the device, i.e. the device area. In this case, since the insulator layer suffers from mechanical damages in a rubbing step, etc. upon sealing liquid crystal material, there is also a problem that production yield is lowered, conjointly with the requirement for precision fabrication.

On the other hand, an MIM device using SiOx or SiNx for the insulator layer (Japanese Patent Application Laid-Open (KOKAI) No. 61-275819), is formed by a vapor phase method such as plasma CVD or sputtering. However, since about 300° C. temperature is usually necessary for the substrate in order to deposit the insulator layer, a substrate of low cost can not be used and, in addition, there is the drawback that the thickness and the quality of the film tend to be uneven because of the temperature distribution of the substrate upon increasing the substrate area. Further, the insulator layer is made of amorphous material showing wide variance in the physical properties and, in view of the problem of optical degradation or optical conductivity (resistance change by light), the degree of freedom for the design of the device characteristics is also narrowed.

Further, since a usual MIM device has a sandwich structure, pinholes or voids are often present, particularly, in an insulator layer such as SiNx or SiOx formed by a vapor-phase method and such device defects lower the yield upon mass production (the defect rate increases). Further, in the case of the sandwich structure, since the device characteristics are extremely sensitive to the thickness of the insulator layer, straight control of the film thickness in order to obtain uniform characteristics and, thus, difficult problems are involved in view of the production techniques.

As a result of the present inventors' earnest studies for overcoming the foregoing problems, it has been found that an active matrix-type liquid crystal display using an MIM device comprising electrodes and an insulator layer of a hard carbon film disposed in a structure coplanar to an insulator substrate as a non-linear resistance device can reduce the number of masking operations required in manufacture, reducing the cost as compared with sandwich structures. Our coplanar structures are suitable for inexpensive mass-production and are substantially free from failures caused by short circuits caused by insulation destruction, even if pinholes or voids occur during the manufacture of the device.

SUMMARY OF THE INVENTION

In an aspect of the present invention, there is provided an active matrix-type liquid crystal display comprising:

two insulation substrates, a liquid crystal layer sandwiched between the insulation substrates, and a picture element electrode and a non-linear resistance device disposed on at least one of the insulation substrates, sandwiched between the liquid crystal layer and the insulation substrate and connected in series with each other, the said non-linear resistance device comprising a first conductor as a bus line electrode, a second conductor as the picture element electrode and a hard carbon film situated therebetween, which are disposed as a structure coplanar to the insulation substrate.

DETAILED DESCRIPTION OF THE INVENTION

Figure 1:
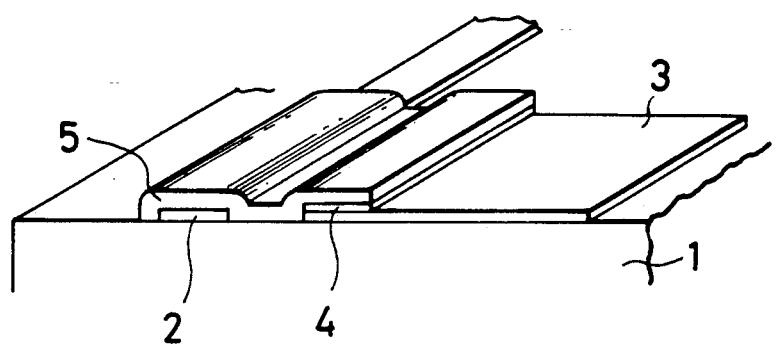
FIGS. 1, 3 and 4 are, respectively, perspective views for a coplanar-type MIM device used for a liquid crystal display according to the present invention.

The liquid crystal display according to the present invention has, as a non-linear resistance device, an MIM device having an insulator layer of a hard carbon film and a coplanar structure coplanar to an insulation substrate.

The hard carbon film insulator layer used in the MIM device according to the present invention is composed of material containing at least one of amorphous and microcrystalline material composed of carbon atoms and hydrogen atoms as the main constituent elements, which are also referred to as i-C film, diamond-like carbon film, amorphous diamond film and diamond thin film.

The physical properties of the hard carbon film as the insulator layer can be controlled over a wide range depending on the film-forming conditions as described later. Accordingly, the resistance value of the insulator layer ranges from that of semi-insulator to an insulator region and, in this meaning, it can be considered as an MSI (metal-semi-insulator) device as shown in Japanese Patent Application Laid-Open (KOKAI) No. 61-275819.

As has been described above, a hard carbon film described in U.S. patent application Ser. No. 07/360,246 filed on Jun. 1, 1989, now pending, can be used for the MIM device comprising an insulation substrate, a lower electrode, a hard carbon film as the insulator layer and an upper electrode, which are disposed on the insulation substrate in order.

For forming the hard carbon film in the present invention, a mixture of gas of an organic compound, preferably a hydrocarbon gas with a gas of another compound described later is used as the the gas starting material. The gas starting material is not necessarily in the vapor phase under normal temperature and normal pressure, and any material in a liquid or solid phase under normal temperature and normal pressure may also be used so long as it is gasifiable by way of melting, vaporization, sublimation, etc. by heating or reduced pressure.

For the hydrocarbon gas as the starting material gas, all of hydrocarbons may be used such as paraffin hydrocarbons, for example, $CH_4$, $C_2H_6$, $C_3H_8$ and $C_4H_{10}$; olefin hydrocarbons, for example, $C_2H_4$ and $C_3H_6$; acetylene hydrocarbons such as $C_2H_2$; diolefin hydrocarbons; and aromatic hydrocarbons.

Further, in addition to hydrocarbons, those compounds capable of forming carbon such as alcohols, ketones, ethers, esters, CO and $CO_2$ may also be used. However, if CO or $CO_2$ is used, hydrogen or hydrocarbons may be used, as occasion demands.

As a method of forming a hard carbon film from a gas starting material in the present invention, it is preferred to use a method in which active species are formed by way of a plasma state formed by a plasma method using direct current, low frequency wave, high frequency wave or microwave. A method of utilizing magnetic field effect is more preferred for deposition under low pressure with an aim of increasing the area, improving the uniformity and forming film at low temperature.

Further, the active species can be formed also by thermal decomposition at high temperature. In addition, they may be formed by way of an ionized state formed by ionization deposition or ion beam deposition, or formed from neutral species generated by vacuum deposition or sputtering. Further, they may be formed by combinations of such methods.

One example for the deposition conditions of the hard carbon film thus formed in a case of a plasma CVD method is set forth.

RF power: 0.1–50 W/cm$^2$

Pressure: $10^{-3}$–10 Torr

Deposition temperature: room temperature—950° C., preferably, room temperature–300° C.

When the gas starting material is decomposed into radicals and ions in the plasmas state and then are reacted the thus produced radicals and ions, a hard carbon film containing at least one of an amorphous state (a-C:H) or an amorphous state containing microcrystalline grains of about 50 Å to 5 μm (including highly microcrystalline states or highly amorphous states), is deposited on the substrate. Various properties of the hard carbon film are shown in Table 1.

TABLE 1

| | |
|---|---|
| Specific resistvity (ρ) | $10^6$–$10^{13}$ ohm · cm |
| Optical band gap (Egopt) | 1.0–3.0 (eV) |
| Amount of hydrogen atom in the film ($C_H$) | 10–50 atm % 10–50 atm % |
| SP$^3$/SP$^2$ ratio | 2/1–4/1 |
| Vickers hardness (H) | 2500–9500 kg · mm$^{-2}$ |
| Refractive Index (n) | 1.9–2.4 |
| Defect density | $10^{17}$–$10^{19}$ cm$^{-3}$ |

(Note)
Measuring method:

| | |
|---|---|
| Specific resistivity (ρ): | dertemined from I-V characteristics by a coplanar type cell |
| Optical band gap (Egopt): | absorption coefficient (α) is determined from spectral characteristics and then determined by the relationship: $(\alpha h\nu)^{\frac{1}{2}} = \beta(h\nu\text{-Egopt})$ |
| Amount of hydrogen atom in the film ($C_H$): | determined by integrating peaks near 2900 cm$^{-1}$ from IR absorptiion, which is multiplied by an absorption cross section A. That is: $C_H = A \cdot \int \frac{\alpha(W)}{W} \cdot dW$ |
| SP$^3$/SP$^2$ ratio: | determined by area ratio of SP$^3$ to SP$^2$, which are obtained by decomposing IR absorption spectrum into Gauss functions belonging respectively to SP$^3$ and SP$^2$. |
| Vickers hardness (H): | determined by microvickers meter |
| Refractive index (n): | determined by ellipsometer |
| Defect density: | determined by ESR |

Figure 6:
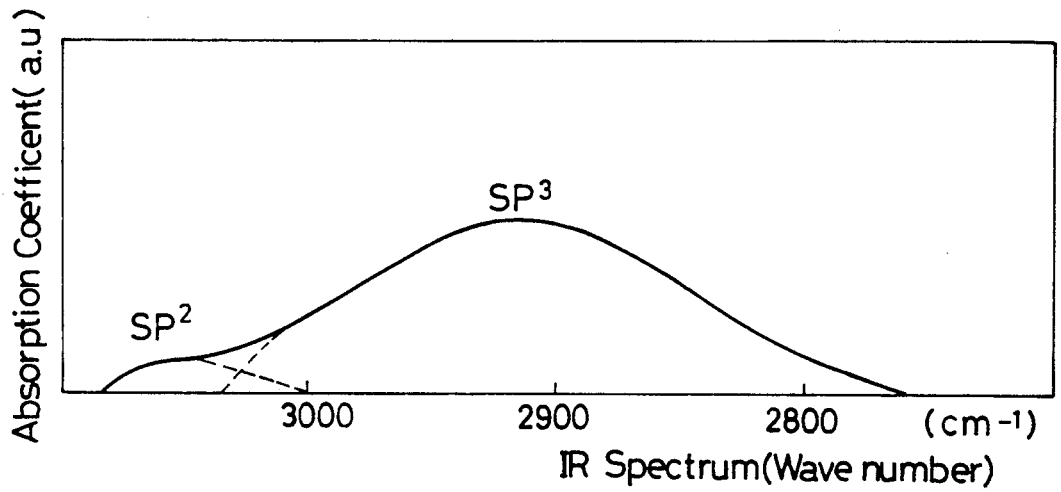
FIGS. 6 and 7 are, respectively, the IR spectrum and Raman spectrum for the hard carbon film insulator layer used in the MIM device according to the present invention.
Figure 7:
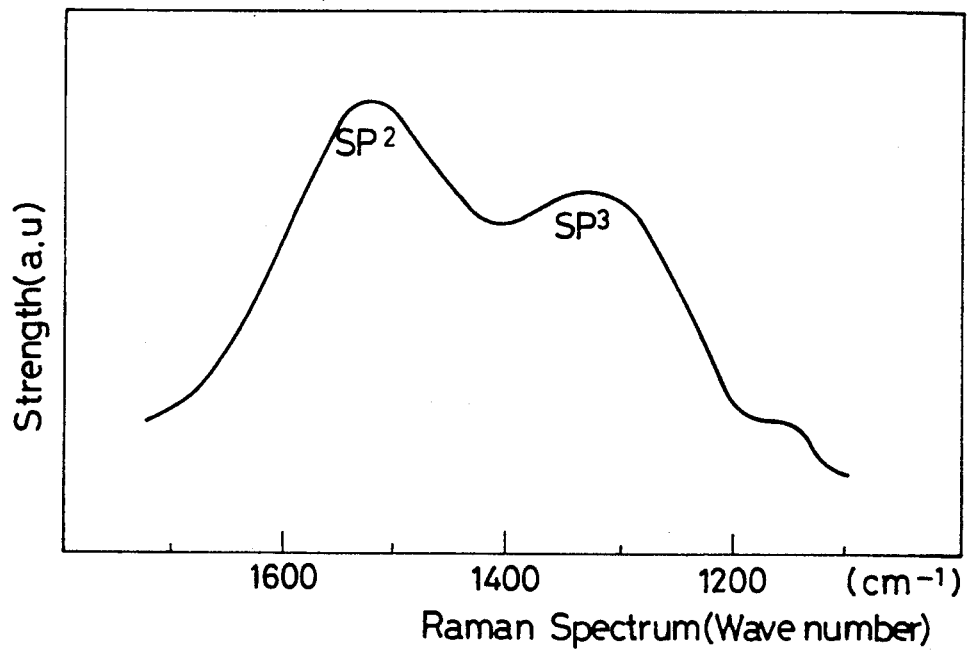
Figure 8:
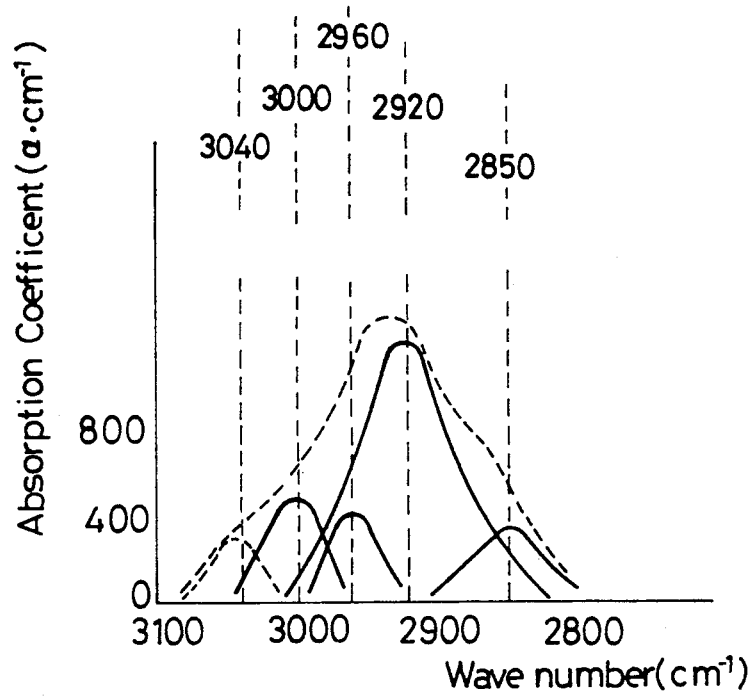
FIG. 8 is a Gauss distribution of the IR spectrum.

As a result of analysis by IR absorption and Raman spectroscopy for the thus formed hard carbon film, it has been known that interatom bondings of carbon atoms in hybrid orbit for SP$^3$ and hybrid orbit for SP$^2$ are present together as shown in FIG. 6 and FIG. 7. The ratio of SP$^3$ bondings to SP$^2$ bondings is generally estimated by peak-separation of the IR spectrum. In the IR spectrum, many modes of spectrum are measured superposed to each other in a range from 2800 to 3150 cm$^{-1}$, the belonging of peaks corresponding to respective wave numbers has been known. SP$^3$/SP$^2$ ratio can be determined by conducting peak separation due to Gauss distribution as shown in FIG. 8 and calculating each of the peak areas.

Further, from X-ray and electron diffractiometry, it has been known that the film is in the form of an amorphous state (a-C:H) and/or an amorphous state containing microcrystalline grains of about 50 Å to 5 μm.

In the case of a plasma CVD method which is generally suitable to mass production, specific resistivity and hardness of a film increase as the RF power is lowered, and since the life of the active species increases at lower RF pressures, it is possible to lower the temperature of a substrate and attain uniform quality in a large area while increasing the specific resistivity and hardness. Further, since the plasma density is reduced at a lower pressure, a method of utilizing the effect of magnetic field confinement is effective due to the increase of the specific resistivity.

Furthermore, since by this method a hard carbon film of good quality can be formed under relatively lower temperature conditions of from normal temperature to about 150° C., it is optimal to conduct the manufacturing process of an MIM device at low temperature. Accordingly, it is possible to widen the degree of freedom for selecting the material of the substrate used and to form a uniform film of a large area due to easy control of the substrate temperature. Further, since the structure and the physical properties of the hard carbon film can be controlled within a wide range as shown in Table 1, there is also the advantage that device characteristics can be designed freely.

The current-voltage characteristic (I-V characteristic) of the MIM device in the present invention is approximated by the following conduction formula:

$$I = x \exp(\beta V^{\frac{1}{2}}) \quad (1)$$

wherein
x: conduction efficient
β: Pool-Frenkel coefficient (coefficient representing the steepness of I-V characteristic, hereinafter referred to as "steepness").

Relationship between x, β and various physical properties of the hard carbon film is represented by the following formulae:

$$x = \frac{n\mu q}{w} \exp\left(\frac{-\phi}{kT}\right) \propto \frac{1}{\rho w} \quad (T = \text{constant}) \quad (2)$$

$$\beta = \frac{1}{kT} \left(\frac{q^3}{\pi \epsilon_r \epsilon_0 w}\right)^{\frac{1}{2}} \propto \frac{1}{\sqrt{\epsilon_r w}} \quad (T = \text{constant}) \quad (3)$$

wherein
n: carrier density
μ: carrier mobility
q: charging amount of electrons
φ: trap depth
ρ: specific resistivity
w: width for the gap in the device portion
k: Boltzman constant
T: atmospheric temperature
$\epsilon_r$: specific dielectric constant of hard carbon film
$\epsilon_0$: dielectric constant in vacuum The merits of using the hard carbon film in view of the formulae (2) and (3) are considered as described below.

(i) Since the specific dielectric constant $\epsilon_r$ of the hard carbon film is as small as 2-6, the steepness β is larger as compared with other insulator (for example, Ta$_2$O$_5$, Al$_2$O$_3$, SiOx, SiNx, SiCx, etc.) and the ratio of ON current ($I_{ON}$) to OFF current ($I_{OFF}$) can be made greater, liquid crystals can be driven at a lower duty ratio, thereby realizing a high density (highly accurate) LCD. Further, since low specific dielectric constant of the film allows a larger size for the device upon preparing a device with an identical electrical capacitance, high precision fabrication is not required and the yield can be improved. (In view of the driving conditions, the capacitance ratio ($C_{LCD}/C_{MIM}$) of not smaller than about 10/1 is necessary between the capacitance of LCD and MIM.).

(ii) Since the specific resistivity ρ of the hard carbon film can be controlled within a wide range of $10^6$ to $10^{13}$ ohm.cm, the electroconduction coefficient x can freely be varied so as to be suitable for the specification demanded for the LCD. That is, there is also an advantage that the device can be designed and controlled easily.

(iii) Further, since the hardness of the film is high, it suffers less from damages by the rubbing treatment upon sealing liquid crystal material and the yield can be improved also in this regard. From the foregoings, LCDs at a reduced cost, with good gradation (coloration) and high density can be realized by using such a hard carbon film.

The thickness of the hard carbon film for the MIM device usable in the present invention is from 100 Å to 10 μm.

In particular, in a coplanar-type MIM device, the film thickness of the hard carbon film, W/L ratio (in which W is width for the gap in the device portion and L is a length for the gap) and a proper range for the specific resistivity are determined depending on the device characteristic suitable for liquid crystal driving. It is advantageous for production that the film thickness is not more than 1 μm in view of the film peeling and the W/L ratio is not less than 1/500 in view of the length for one side of a picture element and the accuracy of photolithography. Depending on the driving conditions in the coplanar-type MIM device, the hard carbon film having the specific resistivity of from $10^4$ to $10^{13}$ ohm.cm, preferably from $10^4$ to $10^{10}$ ohm.cm, more preferably from $10^4$ to $10^8$ ohm.cm, most preferably from $10^4$ to $10^7$ ohm.cm, is usable.

Accordingly, among the hard carbon films of specific resistivity of $10^6$ to $10^{13}$ ohm cm, that is, those having low specific resistivity within the range as described above are preferred as the hard carbon film for the coplanar-type MIM device.

In particular, in the coplanar-type MIM device a hard carbon film obtained by doping the third ingredient as described later of a specific resistivity reduced at least by two digits, i.e. a specific resistivity of $10^4$ to $10^8$ ohm.cm, is preferred.

For controlling the resistance value, improving the stability and heat resistance of the hard carbon film and, further, for improving the hardness of the hard carbon film, as the third ingredient at least one element selected from the group consisting of group III element, group IV elements, group V element of the periodical table, alkali metal elements, alkaline earth metal elements, nitrogen atoms, oxygen atoms, chalcogen atoms or halogen atom can be incorporated therein (as disclosed in pending U.S. patent application Ser. No. 07/482,893 filed on Feb. 22, 1990). Stability of the device and degree of freedom for the device design can further be improved by the doping of the third ingredient.

The number of hydrogen atom contained as one of the constituent elements in the hard carbon film according to the present invention is from 10 to 50 atomic %, preferably 20 to 45 atomic % based on the whole constituent atoms. Also, the number of carbon atoms contained as one of the constituent elements in the hard carbon film according to the present invention is from 50 to 90 atomic %, preferably, 55 to 80 atomic % based on the whole constituent atoms.

As the group III element of the periodical table, there can be exemplified B, Al, Ga and In, and the amount of the element belonging to the group III of the periodical table, contained as one of the constituent elements in the hard carbon film according to the present invention is not more than 5 atomic %, preferably, from 0.001 to 3 atomic % based on the whole constituent atoms.

As the group IV element of the periodical table, there can be exemplified Si, Ge and Sn, and the amount of the group IV element of the periodical table, contained therein as one of the constituent elements is not more than 20 atomic %, preferably from 0.01 to 17 atomic % based on the whole constituent atoms.

As the group V element of the periodical table, there can be exemplified P, As and Sb, and the amount of the group V element of the periodical table, contained therein as one of the constituent elements is not more than 5 atomic %, preferably from 0.001 to 3 atomic % based on the whole constituent atoms.

As the alkali metal element, there can be exemplified Li, Na and K, and the amount of the alkali metal element contained therein as one of the constituent elements is not more than 5 atomic %, preferably from 0.001 to 3 atomic % based on the whole constituent atoms.

As the alkaline earth metal elements, there can be exemplified Ca and Mg, and the amount of the alkaline earth metal element contained therein as one of the constituent elements is not more than 5 atomic %, preferably from 0.001 to 3 atomic % based on the whole constituent atoms.

The amount of the nitrogen atom element contained therein as one of the constituent elements is not more than 5 atomic %, preferably from 0.001 to 3 atomic % based on the whole constituent atoms.

The amount of the oxygen atom element contained therein as one of the constituent elements is not more than 5 atomic %, preferably from 0.001 to 3 atomic % based on the whole constituent atoms.

As the chalcogen element, there can be exemplified S, Se and Te, and the amount of the chalcogen element contained therein as one of the constituent elements is not more than 20 atomic %, preferably from 0.01 to 17 atomic % based on the whole constituent atoms.

As the halogen element, there can be exemplified F, Cl, Br and I, and the amount of the halogen element contained therein as one of the constituent elements is not more than 35 atomic %, preferably from 0.1 to 35 atomic % based on the whole constituent atoms.

The amount of the element or the atom described above can be measured by a customary method of elemental analysis, for example, Auger analysis.

For incorporating at least one of the elements selected from the group consisting of group III elements, group IV element and group V elements of the periodical table, alkali metal elements, alkaline earth metal elements, nitrogen atoms, oxygen atoms, chalcogen elements or halogen atoms as the third ingredient element, a gas of a compound (or molecule) containing these elements in addition to the organic compound gas and hydrogen gas used, if necessary, is used as the gas starting material.

As a compound containing the element belonging to the group III of the periodical table, there can be exemplified $B(OC_2H_5)_3$, $B_2H_6$, $BCl_3$, $BBr_3$, $BF_3$, $Al(O\text{-}i\text{-}C_3H_7)_3$, $(CH_3)_3Al$, $(C_2H_5)_3Al$, $(i\text{-}C_4H_3)_3Al$, $AlCl_3$, $Ga(O\text{-}i\text{-}C_3H_7)_3$, $(CH_3)_3Ga$, $(C_2H_5)_3Ga$, $GaCl_3$, $GaBr_3$, $(O\text{-}i\text{-}C_3H_7)_3In$, and $(C_2H_5)_3In$.

As a compound containing the element belonging to the group IV of the periodical table, there can be exemplified $SiH_4$, $Si_2H_6$, $Si_3H_8$, $(C_2H_5)_3SiH$, $SiF_4$, $SiH_2Cl_2$, $SiCl_4$, $Si(OCH_3)_4$, $Si(OC_2H_5)_4$, $Si(OC_3H_7)_4$, $GeCl_4$, $GeH_4$, $Ge(OC_2H_5)_4$, $Ge(C_2H_5)_4$, $(CH_3)_4Sn$, $(C_2H_5)_4Sn$, and $SnCl_4$.

As a compound containing the element belonging to the group V of the periodical table, there can be exemplified $PH_3$, $PF_3$, $PCl_2F_3$, $PCl_3$, $PCl_2F$, $PBr_3$, $PO(OCH_3)_3$, $P(C_2H_5)_3$, $POCl_3$, $AsH_3$, $AsCl_2$, $AsBr_3$, $AsF_3$, $AsF_5$, $AsCl_3$, $SbH_3$, $SbF_3$, $SbCl_3$, and $Sb(OC_2H_5)_3$.

As the compound containing the alkali metal elements, there can be exemplified $LiO\text{-}i\text{-}C_3H_7$, $NaO\text{-}i\text{-}C_3H_7$ and $KO\text{-}i\text{-}C_3H_7$.

As the compound containing the alkaline earth metal elements, there can be exemplified $Ca(O_2H_5)_3$, $Mg(OC_2H_5)_2$ and $(C_2H_5)_2Mg$.

As the compound containing the nitrogen atom, there can be exemplified nitrogen gas, inorganic compounds such as ammonia, organic compounds having functional groups such as amino groups and cyano groups, and a heterocyclic ring containing nitrogen, etc.

As the compound containing the oxygen atom, there can be exemplified inorganic compounds such as oxygen gas, ozone, water (steam), hydrogen peroxide, carbon monoxide, carbon dioxide, carbon sub-oxide, nitrogen monoxide, nitrogen dioxide, dinitrogen trioxide, dinitrogen pentoxide, nitrogen trioxide, etc.; organic compounds containing functional groups or bonding such as hydroxy groups, aldehyde groups, acyl groups, ketone groups, nitro groups, nitroso groups, sulfone groups, ether bonding, ester bonding, peptide bonding and heterocyclic ring containing oxygen; and metal alkoxide.

As the compound containing chalcogen elements, there can be exemplified $H_2S$, $(CH_3)(CH_2)_4S(CH_2)_4CH_3$, $CH_2\!=\!CHCH_2SCH_2CH\!=\!CH_2$, $C_2H_5SC_2H_5$, $C_2H_5SCH_3$, thiophene, $H_2Se$, $(C_2H_5)_2Se$, $H_2Te$, etc.

Further, as the compound containing halogen atoms, there can be exemplified inorganic compounds such as fluorine, chlorine, bromine, iodine, hydrogen fluoride, chlorine fluoride, bromine fluoride, fluoro carbon, iodine fluoride, hydrogen chloride, bromine chloride, iodine chloride, hydrogen bromide, iodine bromide and hydrogen iodide; and organic compounds such as alkyl halide, aryl halide, styrene halide, polymethylene halide and haloform.

In the MIM device according to the present invention, the insulator layer comprises the hard carbon film as described above and has a structure coplanar to an insulation substrate. An embodiment of the coplanar-type MIM device is explained below in comparison with a conventional sandwich-type MIM device.

Figure 5:
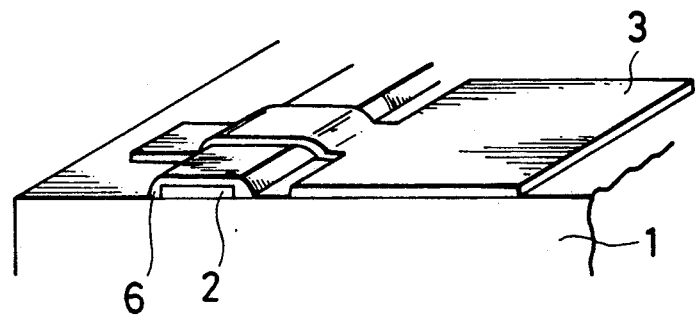
FIG. 5 is a perspective view for one embodiment of a conventional sandwich-type MIM device.

FIG. 5 shows a structure of a conventional sandwich-type MIM device. On a first conductor 2 as a bus line electrode, an insulator layer 6 such as an oxide film ($Ta_2O_5$, $O_3$, etc.) is formed by anodic oxidation or an insulator layer 6 such as SiNx, SiOx, etc. is formed by a vapor phase method and further thereover, a second conductor 3 as a picture element electrode is laminated. A laminated portion of the first conductor 2 - insulator layer 6 - second conductor 3 functions as a switching device. Since the thickness of the insulator layer 6 is usually about from several hundred Å to several thousand Å and the driving voltage is about 20 V, the intensity of the electric field applied on the film is as high as not less than $10^6$ V/cm and the film is readily destroyed if voids, pinholes, etc. are present in the insulator layer 6. In addition, if dusts, obstacles, etc. are present at the inside or the surface of the first conductor 2, pinholes are formed to the insulator layer and as a result, short-circuit failure is liable to occur upon laminating the second conductor 3.

FIGS. 1-4 are embodiments for the MIM device according to the present invention. As shown in FIG. 1, on an insulation substrate 1 formed with a second conductor 3 as a picture element electrode, a first conductor 2 also serving as a bus line and a thin conductor layer as an auxiliary electrode 4 are formed by means of vacuum deposition, sputtering, etc. patterned by means of wet or dry etching into a predetermined pattern to form the first conductor 2 and the auxiliary electrode 4. Then, a hard carbon film 5 is coated thereover by means of a plasma CVD method, an ion beam method, etc. and, thereafter, patterned by a dry etching, wet etching or lift off method using resists into a predetermined pattern, thereby obtaining an MIM device.

Figure 2A:
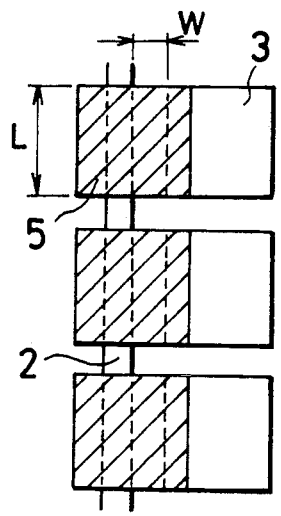
FIG. 2(a) is a transversal cross sectional view of an MIM device shown in FIG. 1.
Figure 2B:
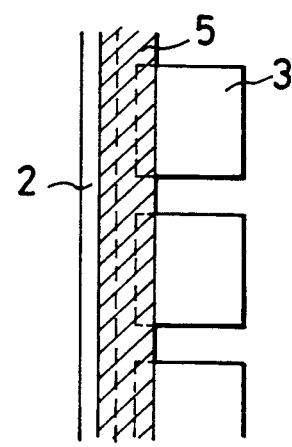
FIGS. 2(b)–(d) are, respectively, views for modifications of the embodiment shown in FIG. 2(a)
Figure 2C:
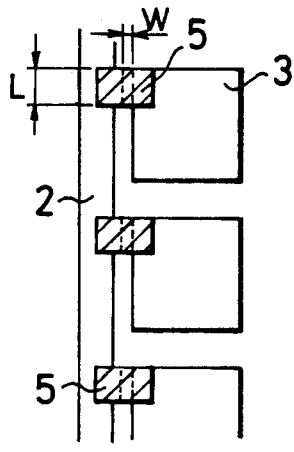
Figure 2D:
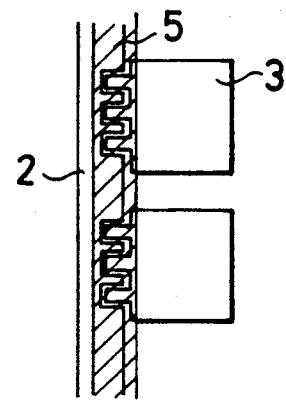

The auxiliary electrode 4 is used for improving the bonding property between the second conductor 3 and the hard carbon film 5, and is inserted therebetween, if necessary. Further, there may be various configurations for the shape of the first conductor 2 and the second conductor 3 (it can be defined also as a shape of the gap between the first conductor and the second conductor), as well as for the pattern of the hard carbon film. These configurations are shown as the transversal cross sectional view in FIGS. 2(a)-(d). FIG. 2(a) corresponds to the perspective view of FIG. 1. FIG. 2(b) has a shape in which the hard carbon film 5 is extended continuously in the longitudinal direction. This configuration may be used if the specific resistivity of the hard carbon film is high since there is no interference with respect to adjacent bits. FIG. 2(c) shows a shape in which only the gap of the device portion is narrowed to reduce short-circuitry between the first conductor 2 and the second conductor 3 caused by pattern failure. FIG. 2(d) shows an inter-digital shape for the first conductor 2 and the second conductor 3, in which the specific resistivity of the hard carbon film is extremely high and the W/L ratio (W: width for the gap in the device portion, L: length of the gap) is to be reduced so as to define the device resistance within a proper range. As described above, various kinds of shapes are possible for the formation of the device depending on the specific resistivity of the hard carbon film, which is not restricted only to the foregoing embodiments.

Figure 3:
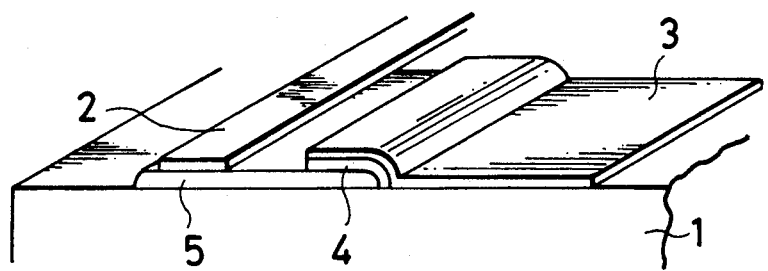

In FIG. 3, the first conductor 2 and the second conductor 3 are formed on the hard carbon film 5, wherein there is no requirement for patterning the hard carbon film 5 in this shape so long as the hard carbon film has an appropriate specific resistivity. This is a preferred shape from the standpoint of decreasing the number of masks needed in manufacture.

Figure 4:
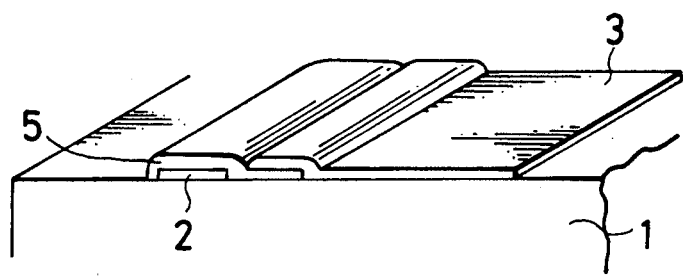

In FIG. 4, a hard carbon film 5 is deposited on a first conductor 2 and then a second conductor 3 is formed so as to be adjacent to the different parts (side) step of the first conductor 2. In this structure, short-circuits between the first conductor and the second conductor can be eliminated entirely, and the gap between them is minimized (to the film thickness of the hard carbon film). Although the hard carbon film is patterned in this illustrated embodiment, there is no particular requirement for such patterning.

As the insulation substrate 1, there can be used glass plate, plastic plate and flexible plastic film. As the material for the first conductor 2 constituting the bus line electrode and, for the auxiliary electrode 4 disposed as required, there can be used various conductors, for example, of metals such as Al, Ni, Cr, Pt, Ag, Au, Cu, Mo, Ta and W, and transparent electrodes, etc. In a case where they are disposed below the hard carbon film as shown FIGS. 1 and 4, Al, Cr, Ni and Cu is preferred in relation with device characteristics and adhesion with the hard carbon film. If they are disposed on the hard carbon film as shown in FIG. 3, Ni, Pt, Ag and Au are preferred for preventing the degradation of characteristics and increasing stability. The second conductor 3 as the picture element electrode is preferably transparent and a transparent conductor such as of ITO, $SnO_2$ or ZnO is used. An appropriate thickness for the first conductor 2 and the second conductor 3 is usually from several hundred Å to several thousand Å respectively.

Figure 9:
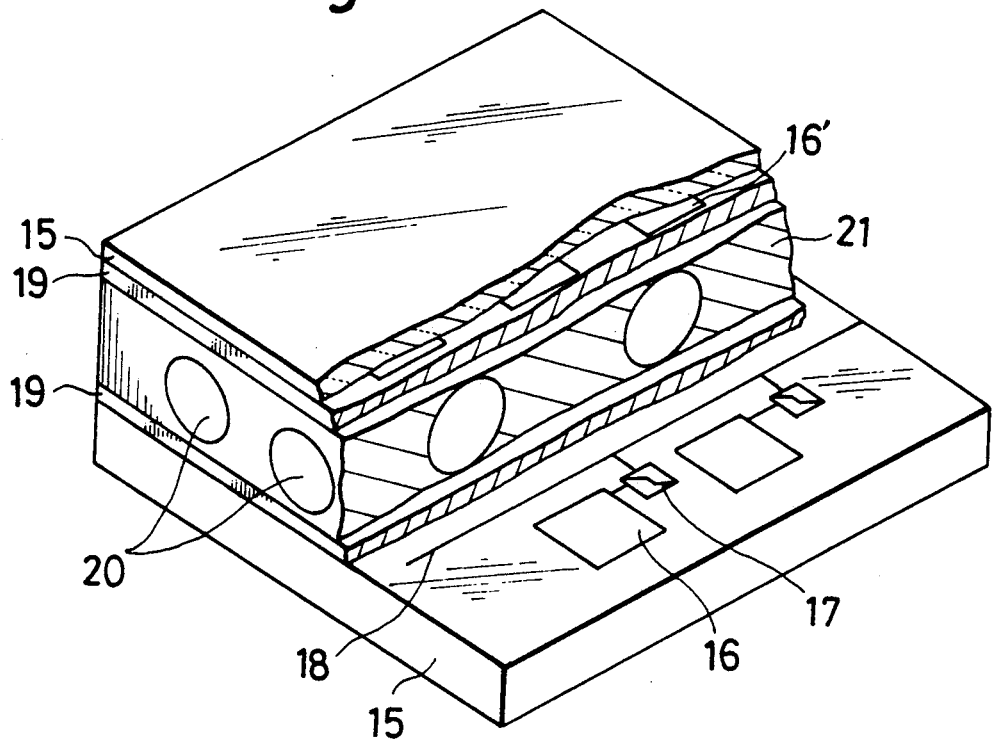
FIG. 9 illustrates an active matrix-type liquid crystal display.

For manufacturing a liquid crystal display according to the present invention by using a substrate having a coplanar-type MIM device as described above, a substrate and an insulation substrate formed with a stripe-like common transparent electrode pattern are prepared and a liquid crystal layer is formed between both of the substrates by a conventional method. FIG. 9 shows one embodiment of such a liquid crystal display.

In FIG. 9, are shown a transparent substrate 15, a picture element electrode 16, a common electrode 16', an MIM device 17, a common electrode or common wiring 18, an orientation film 19, a gap material 20, and a liquid crystal material 21.

As has been described above according to the present invention, the following effects (1-5) are obtained due to the use of a hard carbon film for the insulator layer of an MIM device as a non-linear resistance device.

(1) Since the device is manufactured by a convenient vapor phase method such as a plasma CVD method, physical properties can be controlled over a wide range depending on the film-forming conditions and accordingly, there is a great degree of freedom in view of the device design.

(2) Since the insulator film is made hard and thick, it suffers less from mechanical damages and reduction of pinholes due to increased film thickness can be expected.

(3) Since a high quality film can be formed also at low temperatures near room temperature, there is no restriction for the material of the substrate.

(4) Since the device has highly uniform film thickness and excellent film quality, it is suitable as a thin film device.

Further, since the MIM device is constructed as a coplanar structure, the following effects (5)–(8) can be obtained as well.

(5) Uniform device characteristics and defect ratio due to pinholes, etc. can be improved further to provide an inexpensive active matrix-type liquid crystal display suitable for mass production.

(6) Even if pinholes, voids, etc. are incorporated into the device, the device suffers less from the influence thereof and does not develop short-circuitry due to insulation destruction.

(7) Since the device characteristics depend more on the gap between the first conductor and the second conductor than on the thickness of the hard carbon film, accurate control for the film thickness is not necessary.

(8) The number of masks can be reduced as compared with that in the sandwich-type structure (which may possibly be one throughout the steps), thereby enabling or reduction in the cost.

In particular, since the MIM device has a structure coplanar to the insulation substrate in the present invention, the hard carbon film having the specific resistivity of from $10^4$ to $10^{10}$ ohm.cm, which is lower at least by two digits as compared with that of the conventional sandwich type device, can be used. In particular, a hard carbon film doped with the third ingredient as the insulator layer, having the specific resistivity of from $10^4$ to $10^8$ ohm.cm, can be used, and the degree of freedom for the distance (W) of the electrodes of the MIM device is increased. That is, since the specific resistivity of the hard carbon film is low, the distance between the electrodes can be increased and accordingly, an MIM device as a highly accurate switching device can easily be manufactured.

What is claimed is:

1. An active matrix-type liquid crystal display comprising:

two insulation substrates, a liquid crystal layer sandwiched between said insulation substrates, and a plurality of picture element electrodes, each picture element electrode comprising an electrode of a horizontal non-linear resistance device, said plurality of picture element electrodes disposed on at least one of said insulation substrates, said horizontal non-linear resistance device comprising a first conductor as an electrode, a second conductor as said picture element electrode and a hard carbon film as an insulator, and said first conductor and second conductor being interdigital.

* * * * *